(12) United States Patent
Jeon et al.

(10) Patent No.: US 11,296,139 B2
(45) Date of Patent: Apr. 5, 2022

(54) ARRAY SUBSTRATE FOR DIGITAL X-RAY DETECTOR AND X-RAY DETECTOR INCLUDING THE SAME

(71) Applicant: LG Display Co., Ltd., Seoul (KR)

(72) Inventors: Hyeji Jeon, Changwon-si (KR); Seungyong Jung, Paju-si (KR); Hanseok Lee, Goyang-si (KR); Hyungil Na, Seoul (KR); Jungjune Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 16/223,886

(22) Filed: Dec. 18, 2018

(65) Prior Publication Data

US 2019/0198558 A1 Jun. 27, 2019

(30) Foreign Application Priority Data

Dec. 27, 2017 (KR) .................. 10-2017-0181603

(51) Int. Cl.
| | |
|---|---|
| *H01L 27/146* | (2006.01) |
| *H01L 31/105* | (2006.01) |
| *G01T 1/20* | (2006.01) |
| *H01L 31/0216* | (2014.01) |
| *H01L 31/0224* | (2006.01) |
| *H01L 31/0232* | (2014.01) |

(52) U.S. Cl.
CPC ...... *H01L 27/14663* (2013.01); *G01T 1/2018* (2013.01); *H01L 27/1462* (2013.01); *H01L 27/14603* (2013.01); *H01L 27/14612* (2013.01); *H01L 31/02161* (2013.01); *H01L 31/02322* (2013.01); *H01L 31/022408* (2013.01); *H01L 31/022466* (2013.01); *H01L 31/105* (2013.01); *H01L 27/14636* (2013.01)

(58) Field of Classification Search
CPC ............ G01T 1/2018; H01L 27/14663; H01L 27/14638; H01L 27/14641
See application file for complete search history.

(56) References Cited

U.S. PATENT DOCUMENTS

| | | | |
|---|---|---|---|
| 2008/0191603 A1* | 8/2008 | Kubota ............... | H01L 51/5228 313/498 |
| 2010/0001194 A1* | 1/2010 | Ishii ..................... | G01T 1/2018 250/370.08 |
| 2011/0180714 A1* | 7/2011 | Okada .................... | G01T 1/243 250/354.1 |
| 2013/0136233 A1* | 5/2013 | Okada ............... | H01L 27/14658 378/62 |

* cited by examiner

*Primary Examiner* — Jesse Y Miyoshi
(74) *Attorney, Agent, or Firm* — Seed IP Law Group LLP

(57) ABSTRACT

An array substrate for a digital X-ray detector, and an X-ray detector including the same are disclosed, which reduce or minimize a contact resistance between a bias electrode and a PIN diode, and also improve a fill factor of the PIN diode. In the array substrate, a dual bias electrode in which a second bias electrode formed of a transparent conductive material is connected to a first bias electrode that is additionally connected to an upper electrode of the PIN diode, such that total resistance of the bias electrodes is reduced and a line width of the first bias electrode formed of a non-transparent material is reduced, resulting in an increased fill factor of the PIN diode.

8 Claims, 12 Drawing Sheets

ARRAY SUBSTRATE FOR DIGITAL X-RAY DETECTOR AND X-RAY DETECTOR INCLUDING THE SAME

CROSS-REFERENCE TO RELATED APPLICATION

This application claims the priority of Korean Patent Application No. 2017-0181603 filed on Dec. 27, 2017, in the Korean Intellectual Property Office, the disclosure of which is hereby incorporated by reference in its entirety.

BACKGROUND

Technical Field

The present disclosure relates to an array substrate for an X-ray detector and an X-ray detector including the same.

Description of the Related Art

With the rapid development of digital technology, an X-ray detector based on a thin film transistor (TFT) has recently been developed and rapidly come into medical use. The X-ray detector refers to an apparatus capable of detecting the transmission amount (e.g., transmissivity) of X-rays passing through a subject and displaying internal images of the subject on a display.

Generally, the X-ray detector is designed to have several thousand or tens of thousands of pixels or many more pixels according to the size or resolution thereof. FIG. 1 is a schematic cross-sectional view illustrating a portion corresponding to a single pixel for use in a conventional digital X-ray detector.

The X-ray detector 1 includes a thin film transistor 20 disposed over a substrate 10, a PIN diode 30 connected to the thin film transistor 20, a bias electrode 45 connected to the PIN diode, and a scintillator 50 disposed over the PIN diode 30. In this case, the thin film transistor 20 includes a gate electrode 21, an active layer 23, a source electrode 25, and a drain electrode 27.

When X-rays are emitted to the X-ray detector 1, the scintillator 50 converts the incident X-rays into visible light, such that the visible light is transmitted to the PIN diode 30 disposed below the scintillator 50. The PIN diode 30 includes a lower electrode 31, a PIN layer 33, and an upper electrode 35.

The upper electrode 35 of the PIN diode 30 is connected to a bias electrode 45 through a contact hole 41 formed in a protective layer 40, and the bias electrode 45 transmits a power-supply voltage to the PIN diode 30.

The visible light applied to the PIN diode 30 is reconverted into an electronic signal in a PIN layer 33. The electronic signal is converted into an image signal after passing through the thin film transistor 20 connected to the lower electrode 31 of the PIN diode 30, such that the resultant image signal is displayed on a display.

However, according to the conventional structure in which the upper electrode 35 of the PIN diode 30 is connected to the bias electrode 45 through the contact hole 41, contact resistance increases, such that voltage drop or heat generation may occur. Since the bias electrode 45 is configured to cover the PIN diode 30, a fill factor (i.e., aperture ratio) of the PIN diode 30 may be reduced by as much as the region occupied by the bias electrode 45.

The fill factor refers to the ratio of the light reception region of the X-ray detector 1 to one pixel region. In more detail, the fill factor is defined by the ratio of the region of the PIN diode 30 to one pixel region. Therefore, if the fill factor is reduced, although visible light corresponding to the reduced fill factor is emitted to the PIN diode 30, the number of electric signals to be converted is also reduced by reduction of the light reception region, such that performance or throughput of the X-ray detector is also deteriorated.

Therefore, the fill factor is generally reduced by as large as the light reception region of the PIN diode 30 covered by the bias electrode 45 formed of a non-transparent material, such that a method for minimizing reduction in fill factor is needed.

Specifically, since the bias electrode 45 is formed to have a larger size in the vicinity of a contact hole 41 of the protective layer 40 through which the bias electrode 45 is connected to the upper electrode 35, the size of a light reception region covered by the bias electrode 45 is increased by the increased size of the bias electrode 45, such that the conventional structure may reduce a fill factor (also called aperture ratio).

BRIEF SUMMARY

Therefore, the present disclosure has been made in view of the above problems, and embodiments of the present disclosure provide an array substrate for a digital X-ray detector to reduce contact resistance between a bias electrode and a PIN diode, and the digital X-ray detector including the same.

Another embodiment of the present disclosure provides an array substrate for a digital X-ray detector to improve a fill factor by minimizing the size of a light reception region of a PIN diode covered by a bias electrode, and the digital X-ray detector including the same.

Embodiments of the present disclosure are not limited to the above-described advantages as can be appreciated by those skilled in the art from the following description. Further, it will be easily appreciated that the objects and advantages of the present disclosure can be practiced by means recited in the appended claims and a combination thereof.

Various embodiments of the present disclosure are directed to providing an array substrate for a digital X-ray detector and the X-ray detector including the same that substantially obviate one or more problems due to limitations and disadvantages of the related art.

In accordance with one embodiment of the present disclosure, an array substrate for a digital X-ray detector includes a base substrate, a thin film transistor disposed over the base substrate, a PIN diode including a lower electrode connected to the thin film transistor, a PIN layer disposed over the lower electrode, and an upper electrode disposed over the PIN layer, a first bias electrode disposed over the PIN diode, and a second bias electrode disposed over the first bias electrode.

The array substrate includes a dual bias electrode structure provided with both a first bias electrode and a second bias electrode, such that contact resistance between the bias electrode and a lower electrode of the PIN diode is reduced. Specifically, differently from the first bias electrode formed of a non-transparent conductive material, the second bias electrode is formed of a transparent conductive material such as ITO, such that fill factor reduction of the PIN diode is minimized and contact resistance is also reduced.

Array substrates according to embodiments of the present disclosure include the following embodiments.

In a first embodiment, the first bias electrode is connected to the upper electrode, and the second bias electrode is connected to the first bias electrode, wherein the second bias electrode is disposed to cover the entirety of the base substrate.

In a second embodiment, the first bias electrode is connected to the upper electrode, and the second bias electrode is connected to the first bias electrode, wherein the second bias electrode is arranged parallel to the first bias electrode. The second bias electrode may have a constant line width.

In a third embodiment, the first bias electrode is connected to the upper electrode, and the second bias electrode is connected to the first bias electrode, wherein the second bias electrode is arranged perpendicular to the first bias electrode. The second bias electrode may have a constant line width.

In the first to third embodiments, a second bias electrode connected to the first bias electrode is additionally arranged to reduce total resistance between the bias electrodes, such that a line width of the first bias electrode is reduced, resulting in an increased fill factor.

In a fourth embodiment, the first bias electrode is connected to the upper electrode, and the second bias electrode is connected to the first bias electrode, wherein the second bias electrode is arranged in a contact margin region between the first bias electrode and the upper electrode. The first bias electrode may have a constant line width.

In a fifth embodiment, the first bias electrode is connected to the second bias electrode, and the second bias electrode is connected to the upper electrode, wherein the second bias electrode is arranged perpendicular to the first bias electrode. The first bias electrode has a constant line width.

In the fourth and fifth embodiments, a separate contact margin region capable of being formed when the first bias electrode contacts the upper electrode is no longer required, and total resistance of the bias electrodes is reduced, resulting in reduction of a line width of the first bias electrode. That is, the fill factor of the PIN diode can be increased by the reduced line width of the first bias electrode and the size of the contact margin region.

DETAILED DESCRIPTION

Figure 1:
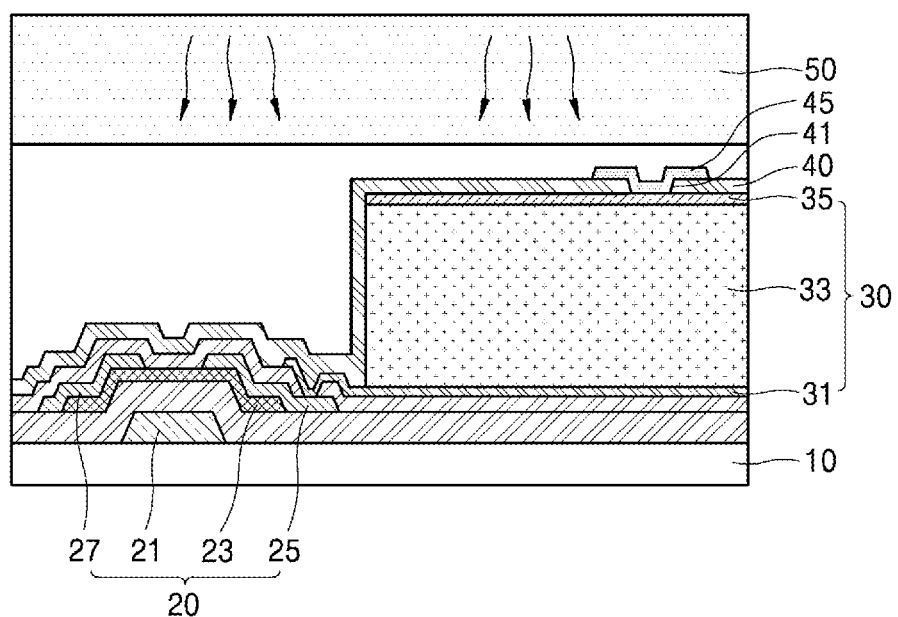
FIG. 1 is a schematic cross-sectional view illustrating an array substrate for a conventional digital X-ray detector according to the related art.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

Figure 2:
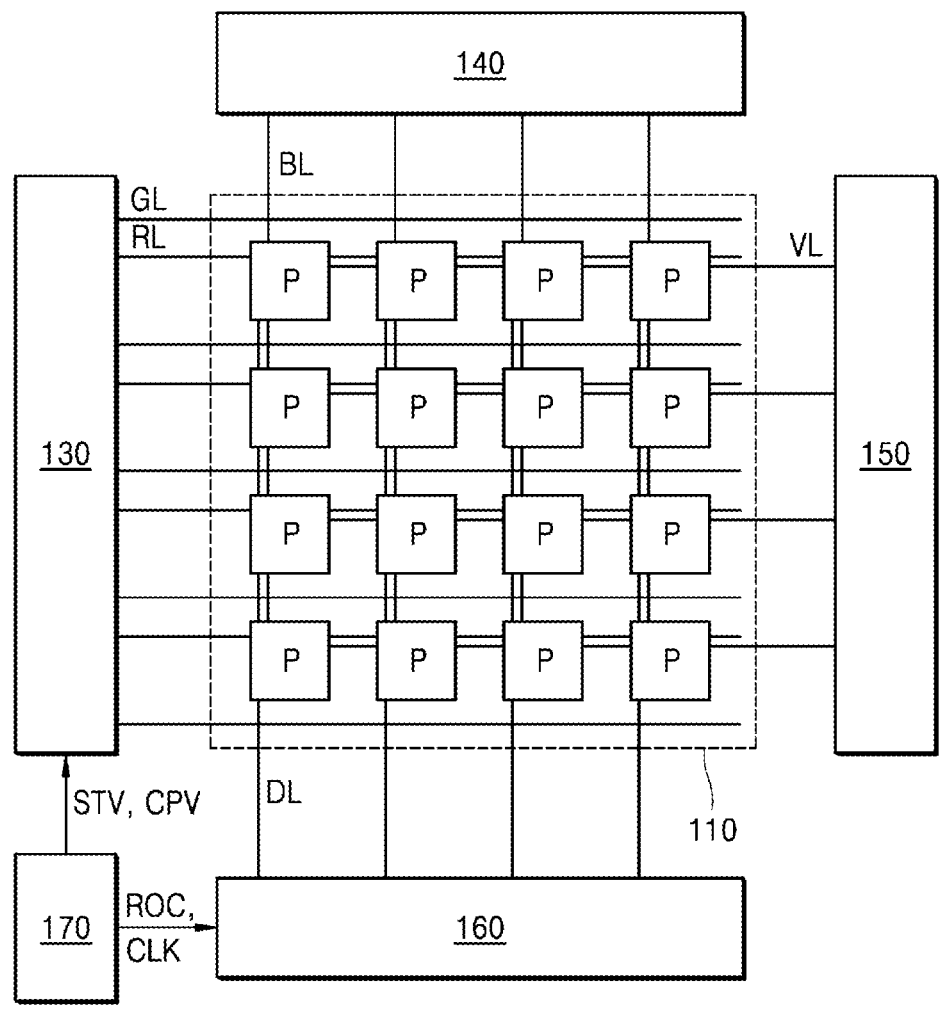
FIG. 2 is a schematic block diagram illustrating a digital X-ray detector according to an embodiment of the present disclosure.

FIG. 2 is a schematic plan view illustrating a digital X-ray detector.

Referring to FIG. 2, the digital X-ray detector may include a thin film transistor (TFT) array 110, a gate driver 130, a bias supply 140, a power supply 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate In Panel (GIP) process.

The bias supply 140 may apply a drive voltage through bias lines (BL). The bias supply 140 may apply a predetermined voltage to the PIN diode. In this case, the bias supply 140 may selectively apply a reverse bias or a forward bias to the PIN diode.

The power-supply 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc., The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc., to the gate driver 130. In order to control the readout circuit 160, the timing controller 170 may generate a readout control signal (ROC), a readout clock signal (CLK), etc., and may transmit the readout control signal (ROC), the readout clock signal (CLK), etc., to the readout circuit 160.

First to fifth embodiments of the array substrate for the digital X-ray detector corresponding to a single pixel region will hereinafter be described with reference to FIGS. 3 to 7. Common parts of the first to fifth embodiments will be first described, and different parts of the first to fifth embodiments will hereinafter be described in detail. In addition, the same contents of the first to fifth embodiments will hereinafter be equally applied to other embodiments unless otherwise mentioned in other embodiments.

A plurality of gate lines GL and a plurality of data lines DL perpendicular to the plurality of gate lines GL may be disposed over the base substrate 210. Pixel regions (PA) may be defined by intersection regions of the gate lines GL arranged in one direction and the data lines DL arranged in the other direction perpendicular to the gate lines GL.

Intersection regions of the gate lines GL arranged in one direction and the data lines DL arranged in the other direction perpendicular to the gate lines GL may include a plurality of pixel regions (PA) arranged in a matrix. Arrangement relationship of devices included in a single pixel region (PA) will hereinafter be described, and may also be equally applied to other pixel regions (PA) unless otherwise specifically stated.

A separate thin film transistor 220 may be formed for each pixel region (PA) so as to correspond to the single pixel region (PA). Therefore, a plurality of thin film transistors 220 may be disposed over the base substrate 210 defined by the plurality of pixel regions PA. In this case, although a buffer layer, that is formed of a monolayer or multilayer structure formed of a silicon oxide (SiOx) film or silicon nitride (SiNx) film, may be disposed between the base substrate 210 and the thin film transistor 220, the buffer layer may also be omitted according to materials formed over the base substrate 210 as necessary.

In more detail, the thin film transistor 220 may be formed to include a gate electrode 223, an active layer 221, a source electrode 226a, and a drain electrode 226b.

In order to prevent reduction of the fill factor of the PIN diode 230, the thin film transistor 220 connected to the gate line GL and the data line DL may be disposed close to an overlapping portion or intersection point of the gate line GL and the data line DL.

The active layer 221 may be disposed over the base substrate 210. The active layer 221 may include a source region 221b and a drain region 221c disposed at both sides on the basis of the channel region 221a. In this case, the active layer 221 may be formed of an oxide semiconductor material such as indium gallium zinc oxide (IGZO), or may also be formed of a Low Temperature Polycrystalline Silicon (LTPS) material or an amorphous silicon (a-Si).

A gate insulation layer 222 corresponding to the channel region 221a may be disposed over the active layer 221. The gate insulation layer 222 may be a monolayer or multilayer structure formed of a silicon oxide (SiOx) film or a silicon nitride (SiNx) film.

A gate electrode 223 formed of a conductive material corresponding to the channel region 221a may be disposed over the gate insulation layer 222. The gate electrode 223 may be formed of any one material selected from a group composed of molybdenum (Mo), aluminum (Al), chrome (Cr), gold (Au), titanium (Ti), nickel (Ni), and copper (Cu), or may be formed of alloys thereof. The gate electrode 223 may be formed of a monolayer or multilayer structure.

An interlayer insulation layer 224 may be disposed to cover the gate electrode 223 and the active layer 221. A first contact hole 225a corresponding to the source region 221b of the active layer 221 and a first contact hole 225b corresponding to the drain region 221c of the active layer 221 may be formed over the interlayer insulation layer 224. The source electrode 226a and the drain electrode 226b may be disposed over the interlayer insulation layer 224, such that the source electrode 226a may be connected to the source region 221b through the first contact hole 225a, and the drain electrode 226b may be connected to the drain region 221c through the first contact hole 225b. A first protective layer 227 covering the entire surface of the base substrate 210 may be disposed over the source electrode 226a and the drain electrode 226b. In the first protective layer 227, a second contact hole 228 may be formed to correspond to the source electrode 226a. A lower electrode 231 of the PIN diode 230 may be disposed over the first protective layer 227, such that the lower electrode 231 may be connected to the source electrode 226a of the thin film transistor 220 through the second contact hole 228.

The PIN diode 230 may be disposed over the pixel region (PA). The lower electrode 231 of the PIN diode 230 being connected to the thin film transistor 220 through the second contact hole 228 may be formed over the first protective layer 227. The lower electrode 231 may be formed of a non-transparent conductive material (for example, any one material selected from a group composed of molybdenum (Mo), aluminum (Al), chrome (Cr), gold (Au), titanium (Ti), nickel (Ni), and copper (Cu), or alloys thereof), or may be formed of a transparent conductive material such as indium tin oxide (ITO), indium zinc oxide (IZO), or zinc oxide (ZnO) according to characteristics of the PIN diode 230.

The PIN layer 233 may be disposed over the lower electrode 231 of the PIN diode 230. In more detail, the PIN layer 233 in which an N-type (negative) semiconductor layer having N-type impurities, an intrinsic (I-type) semiconductor layer having no impurities, and a P-type (positive) semiconductor layer including P-type impurities are sequentially stacked, may be formed.

The intrinsic (I-type) semiconductor layer may be formed to have a larger thickness as compared to the N-type semiconductor layer and the P-type semiconductor layer. The PIN layer 233 may include a material capable of converting visible light converted from X-rays through the scintillator layer 290 into an electric signal. For example, the PIN layer 233 may include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

An upper electrode 235 corresponding to the PIN layer 233 may be disposed over the PIN layer 233. The upper electrode 235 may be formed of a transparent conductive material such as indium tin oxide (ITO), indium zinc oxide (IZO), or zinc oxide (ZnO) so as to increase light transmission efficiency of the scintillator layer 290 that receives X-rays and performs conversion of a wavelength of the X-rays.

Figure 3A:
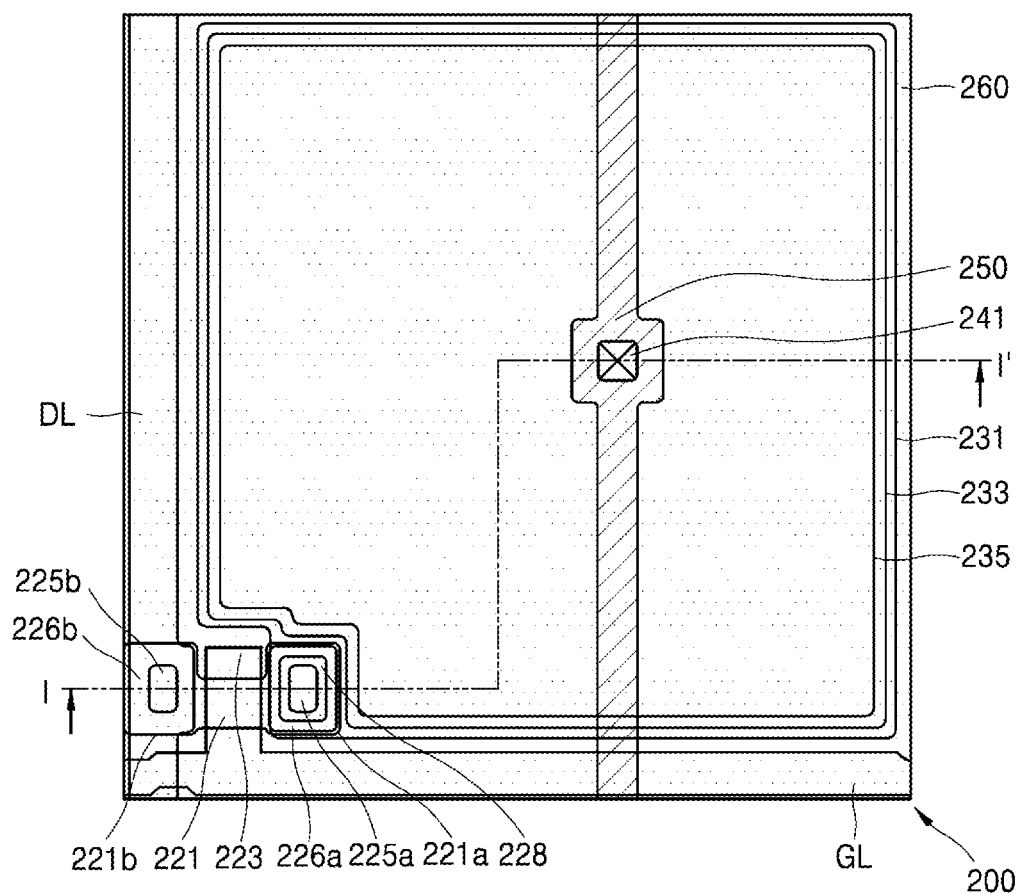
FIGS. 3A and 3B respectively illustrate a plan view and a cross-sectional view illustrating an array substrate for a digital X-ray detector according to a first embodiment of the present disclosure.
Figure 3B:
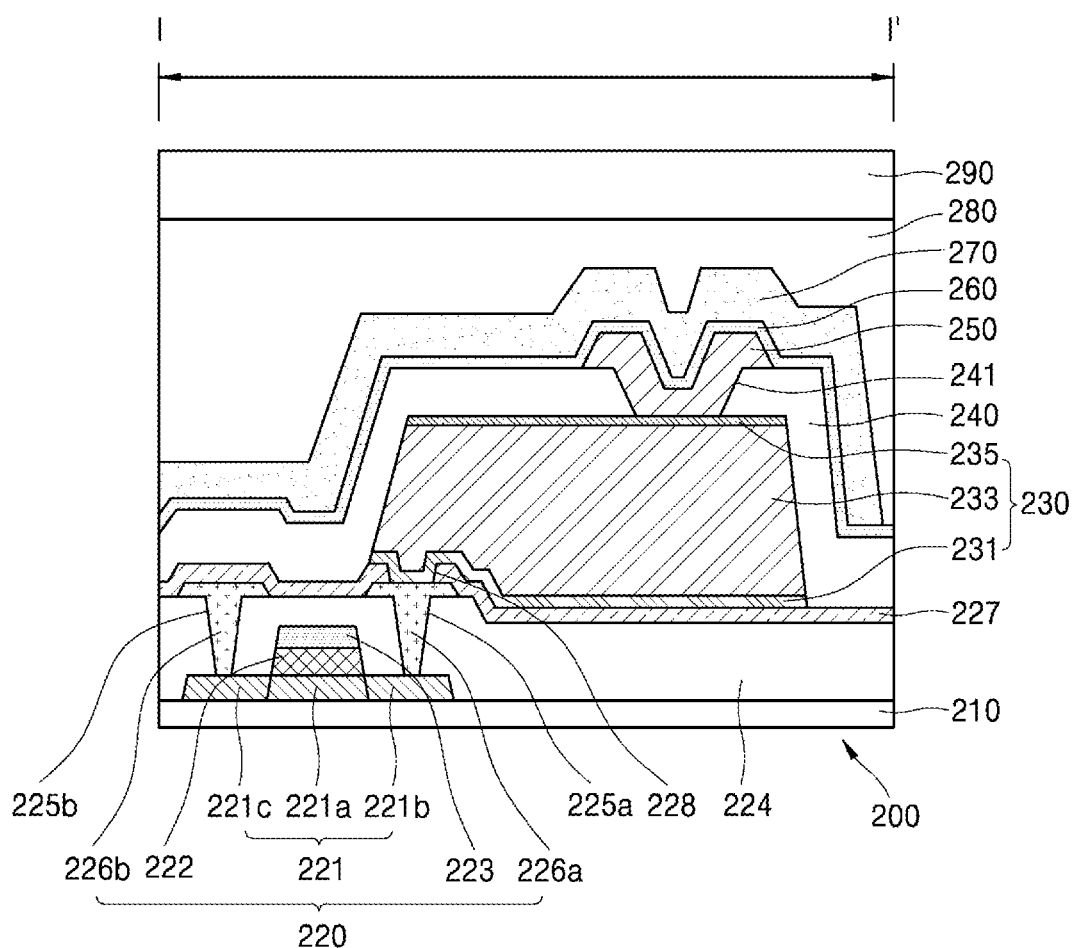

In accordance with the first embodiment shown in FIGS. 3A and 3B, a second protective layer 240 formed to cover the entire surface of the base substrate 210 including the upper electrode 235 may be disposed over the upper electrode 235. In this case, the second protective layer 240 corresponding to the upper electrode 235 may be provided with a third contact hole 241, and a first bias electrode 250 may be disposed over the second protective layer 240, such that the first bias electrode 250 may be connected to the upper electrode 235 of the PIN diode 230 through the third contact hole 241. The first bias electrode 250 may be formed of a non-transparent conductive material, and may also be formed of any one material selected from a group composed of molybdenum (Mo), aluminum (Al), chrome (Cr), gold (Au), titanium (Ti), nickel (Ni), and copper (Cu), or may be formed of alloys thereof.

In this case, a bias line region corresponding to each pixel region may be defined as the first bias electrode 250 in a bias line BL arranged parallel to the data line DL over the entire surface of the array substrate 200. The first bias electrode 250 of each pixel region arranged parallel to the data line may be connected to form a single bias line. A second bias electrode 260 connected to the first bias electrode 250 may be disposed over the first bias electrode 250. In this case, the second bias electrode 260 may be disposed to cover the entire surface of the base substrate 210 including the first bias electrode 250, and may be disposed to cover all the pixel regions disposed over the base substrate 210. Therefore, all the first bias electrodes 250 of the respective pixel regions may be interconnected by the second bias electrode 260.

The second bias electrode 260 may be formed of a transparent oxide material such as indium tin oxide (ITO), indium zinc oxide (IZO), or zinc oxide (ZnO).

As described above, since the first embodiment of the present disclosure has a dual bias electrode structure, the entire region of the bias electrode is increased in size, such that contact resistance between the bias electrode and the upper electrode 235 of the PIN diode 230 can be reduced.

Specifically, the second bias electrode 260 is formed of a transparent conductive material such as ITO in a different way from the first bias electrode 250, such that the light reception region of the PIN diode 230 is not reduced in size, and fill factor reduction can be minimized.

In addition, since the second bias electrode 260 is formed across the entire surface of the array substrate 200, the first bias electrodes 250 of the respective pixel regions are connected to reduce total resistance of the first bias electrode 250, such that a line width (also called a critical dimension CD) of a non-transparent first bias electrode 250 (i.e., a non-transparent bias line) can be reduced.

Therefore, the size of the light reception region of the PIN diode 230 is increased by a reduced line width of the non-transparent first bias electrode 250, resulting in an increased fill factor of the PIN diode 230.

Figure 4A:
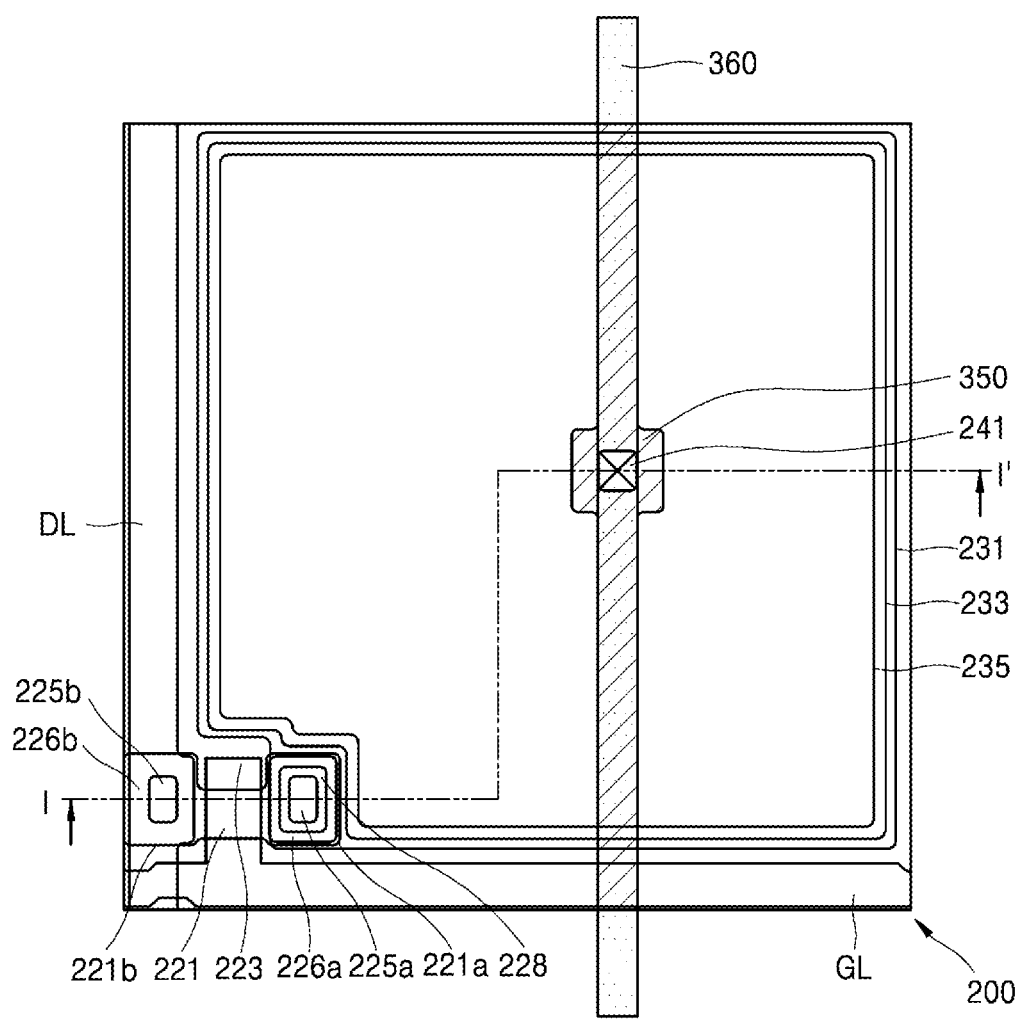
FIGS. 4A and 4B respectively illustrate a plan view and a cross-sectional view illustrating an array substrate for a digital X-ray detector according to a second embodiment of the present disclosure.
Figure 4B:
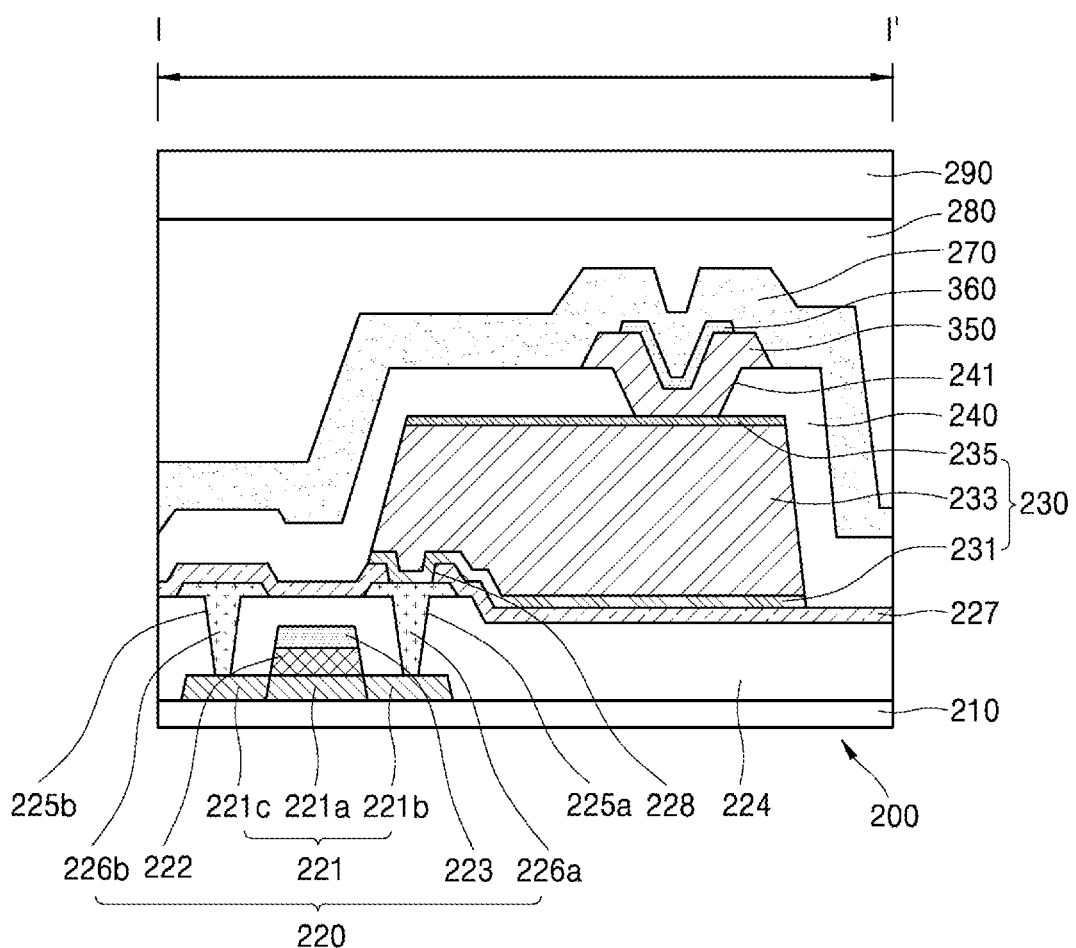

In accordance a second embodiment shown in FIGS. 4A and 4B, a second protective layer 240 formed to cover the entire surface of the base substrate 210 including the upper electrode 235 may be disposed over the upper electrode 235. In this case, the second protective layer 240 corresponding to the upper electrode 235 may be provided with a third contact hole 241. A first bias electrode 350 may be formed over the second protective layer 240, such that the first bias electrode 350 may be connected to the upper electrode 235 of the PIN diode 230 through the third contact hole 241.

A second bias electrode 360 connected to the first bias electrode 350 may be disposed over the first bias electrode 350. In this case, the second bias electrode 360 may be arranged parallel to the first bias electrode 350.

The second embodiment has a dual bias electrode structure to increase the entire surface of the bias electrode, such that contact resistance between the bias electrode and the upper electrode 235 of the PIN diode 230 can be reduced.

In addition, the second bias electrode 360 may be disposed over the first bias electrode 350, such that the second bias electrode 360 overlaps the first bias electrode 350 and has a constant line width (critical dimension), resulting in a minimum or smaller reduction in fill factor. In this case, the second bias electrode 360 may have a line width (critical dimension) corresponding to a line width (critical dimension) of the first bias electrode 350, and may have a larger line width than the line width of the first bias electrode 350 such that the second bias electrode 360 may also cover the first bias electrode 350.

In addition, the second bias electrode 360 is connected to the first bias electrode 350, such that total resistance of the first bias electrode 350 can be reduced, resulting in reduction in a line width of a non-transparent bias electrode 350 (i.e., a non-transparent bias line).

Therefore, the light reception region of the PIN diode 230 is increased by the reduced line width of the non-transparent first bias electrode 350, such that the fill factor of the PIN diode 230 can be increased.

The second bias electrode 360 may be formed across the plurality of pixel regions, such that the first bias electrodes 350 may be formed along the connected bias line.

Figure 5A:
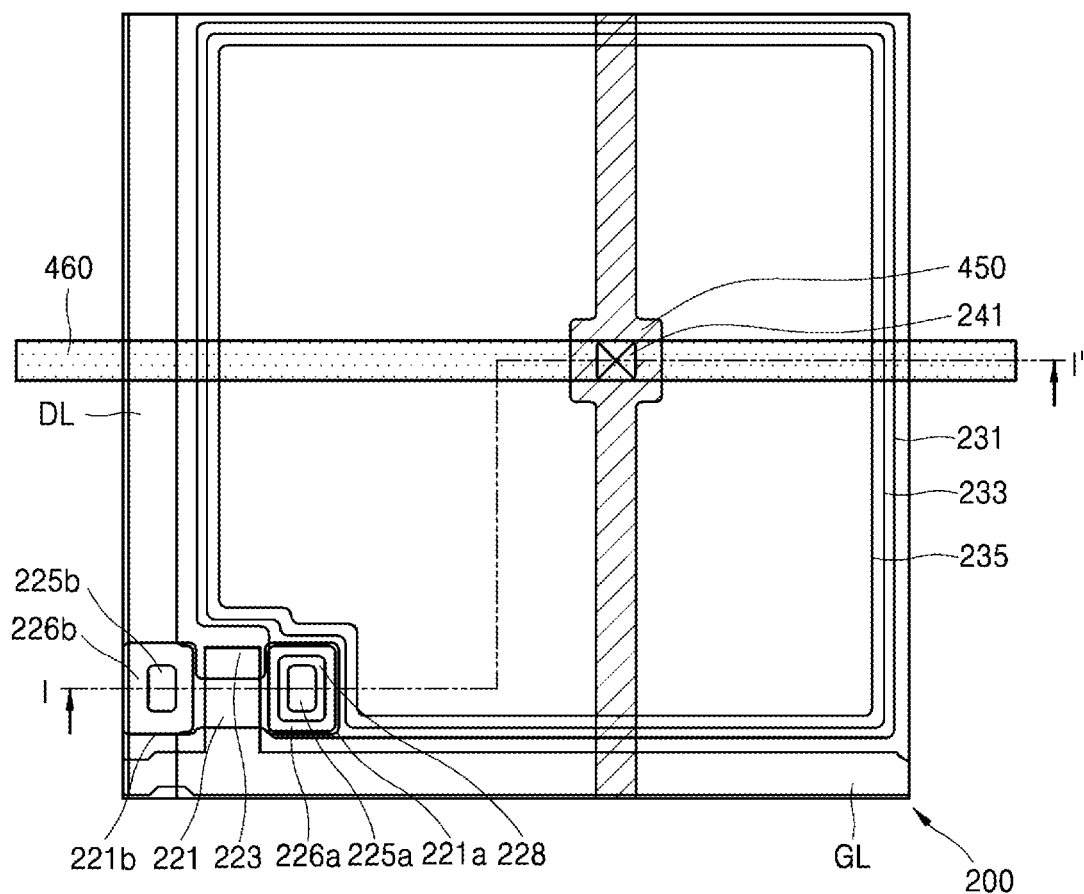
FIGS. 5A and 5B respectively illustrate a plan view and a cross-sectional view illustrating an array substrate for a digital X-ray detector according to a third embodiment of the present disclosure.
Figure 5B:
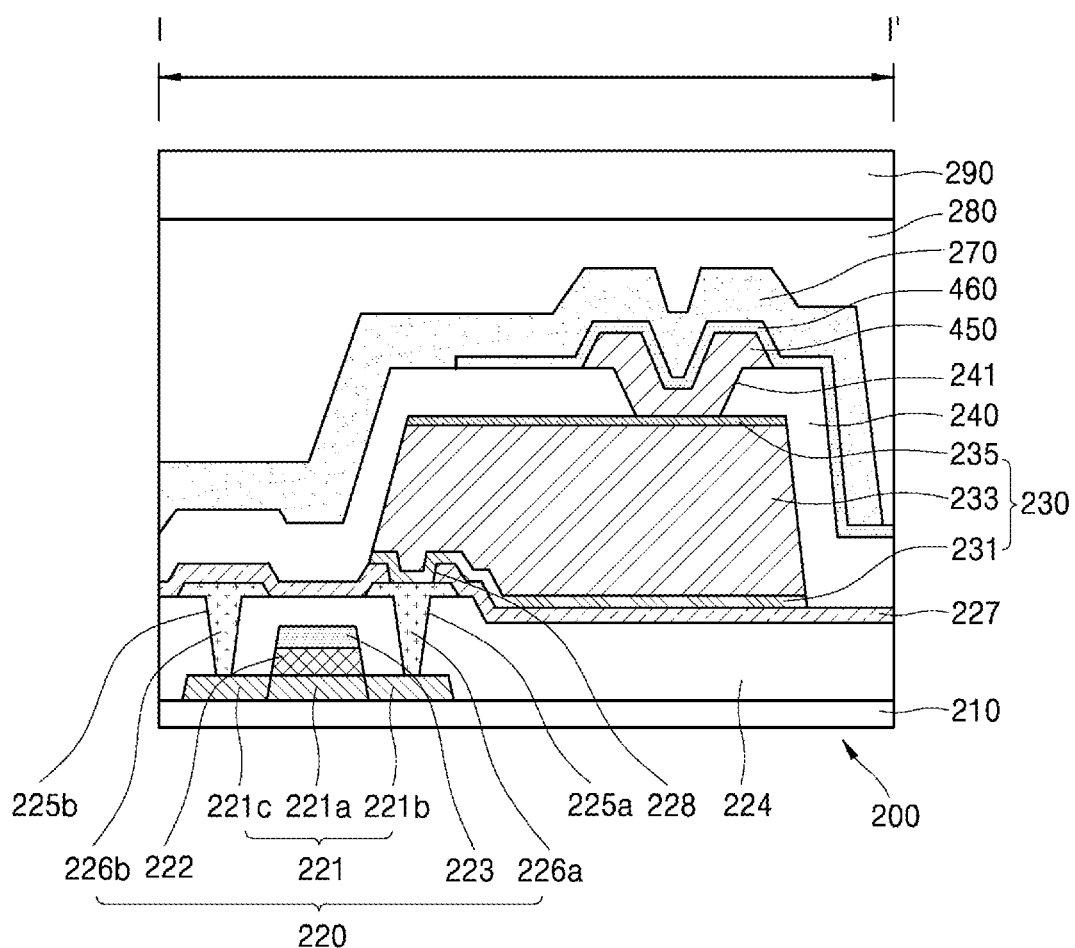

In accordance with the third embodiment shown in FIGS. 5A and 5B, the second protective layer 240 formed to cover the entire surface of the base substrate 210 including the upper electrode 235 may also be disposed over the upper electrode 235. In this case, the second protective layer 240 corresponding to the upper electrode 235 may be provided with a third contact hole 241, and a first bias electrode 450 may be disposed over the second protective layer 240, such that the first bias electrode 450 may be connected to the upper electrode 235 of the PIN diode 230 through the third contact hole 241. A second bias electrode 460 connected to the first bias electrode 450 may be disposed over the first bias electrode 450. In this case, the second bias electrode 460 may be arranged perpendicular to the first bias electrode 450, and may be formed to have a constant line width (critical dimension CD).

As described above, the third embodiment has a dual bias electrode structure, such that the entire region of the bias electrode can be increased in size, and contact resistance between the bias electrode and the upper electrode 235 of the PIN diode 230 can be reduced.

The second bias electrode 460 may be arranged perpendicular to the first bias electrode 450 such that the second bias electrode 460 may pass through the third contact hole 241 where the first bias electrode 450 is connected to the PIN diode 230. That is, the second bias electrode 460 may be configured in a mesh structure formed across the plurality of pixel regions, such that the second bias electrode 460 may be arranged to cross the respective bias lines connected to the first bias electrodes 450, and all the first bias electrodes 450 of the respective pixel regions can be electrically interconnected. As a result, total resistance of the first bias electrode 450 can be reduced, such that a line width of the non-transparent first bias electrode 450 (i.e., a non-transparent bias line) can be reduced.

Therefore, the light reception region of the PIN diode 230 is increased by the reduced line width of the non-transparent first bias electrode 450, such that the fill factor of the PIN diode 230 can be increased.

Figure 6A:
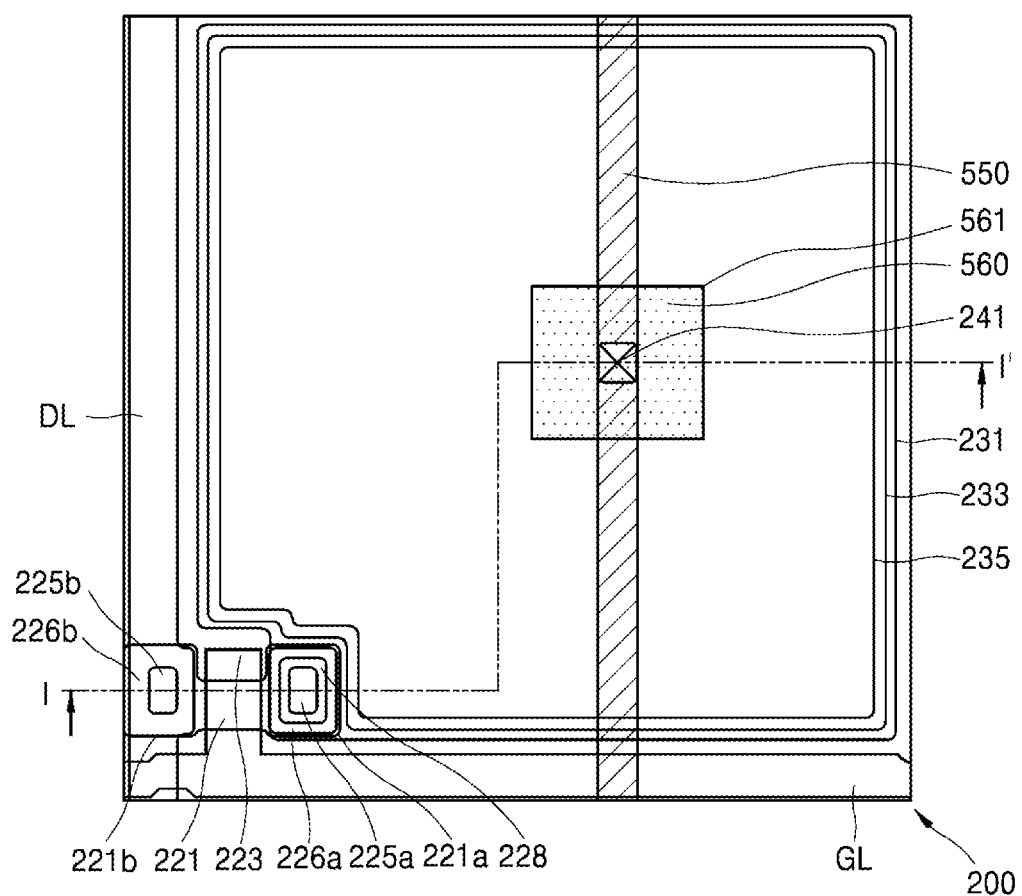
FIGS. 6A and 6B respectively illustrate a plan view and a cross-sectional view illustrating an array substrate for a digital X-ray detector according to a fourth embodiment of the present disclosure.
Figure 6B:
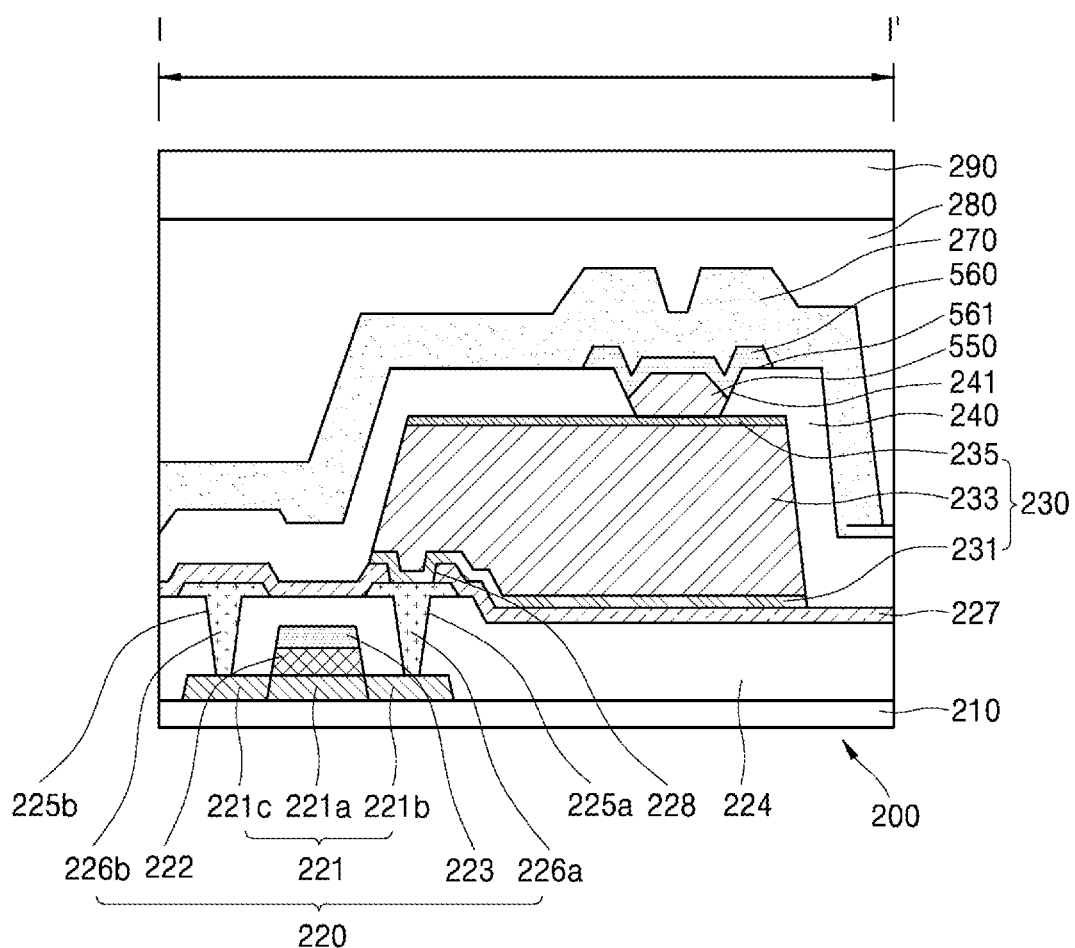

In accordance with the fourth embodiment shown in FIGS. 6A and 6B, the second protective layer 240 formed to cover the entire surface of the base substrate 210 including the upper electrode 235 may also be disposed over the upper electrode 235. In this case, the second protective layer 240 corresponding to the upper electrode 235 may be provided with a third contact hole 241, and a first bias electrode 550 may be disposed over the second protective layer 240, such that the first bias electrode 550 may be connected to the upper electrode 235 of the PIN diode 230 through the third contact hole 241.

When the first bias electrode 550 is connected to the upper electrode 235 within the region of the third contact hole 241, the first bias electrode 550 does not extend to the second protective layer 240 located in the vicinity of the third contact hole 241, may be formed only in the region of the third contact hole 241, or may be disposed to bury only some regions within the third contact hole 241.

Generally, if one electrode contacts the other electrode within the contact hole, a contact margin region for increasing the size of a contact region between the electrodes may be formed in a peripheral part of the contact hole. In contrast, according to the fourth embodiment of the present disclosure, the first bias electrode 550 is not formed in a contact margin region 561 between the first bias electrode 550, that is formed over the second protective layer 240 located in the vicinity of the third contact hole 241, and the upper electrode 235, and a second bias electrode 560 is disposed in the contact margin region 561. Therefore, the first bias electrode 550 does not include a contact margin region, and has a constant line width (critical dimension).

As described above, according to the fourth embodiment, the contact margin region 561 between the first bias electrode 550 and the upper electrode 235 is implemented as the second bias electrode 560 formed of a transparent conductive material, such that the light reception region of the PIN diode 230 is not reduced and reduction of the fill factor is minimized.

In addition, there is a dual bias electrode structure, such that the entire region of the bias electrode is increased to reduce contact resistance between the first bias electrode 550 and the upper electrode 235 of the PIN diode 230. As a result, a line width (critical dimension) of a non-transparent first bias electrode 550 (i.e., a non-transparent bias line) may be reduced.

Therefore, the light reception region of the PIN diode 230 is increased by the reduced line width of the non-transparent first bias electrode 550, resulting in an increased fill factor of the PIN diode 230.

Figure 7A:
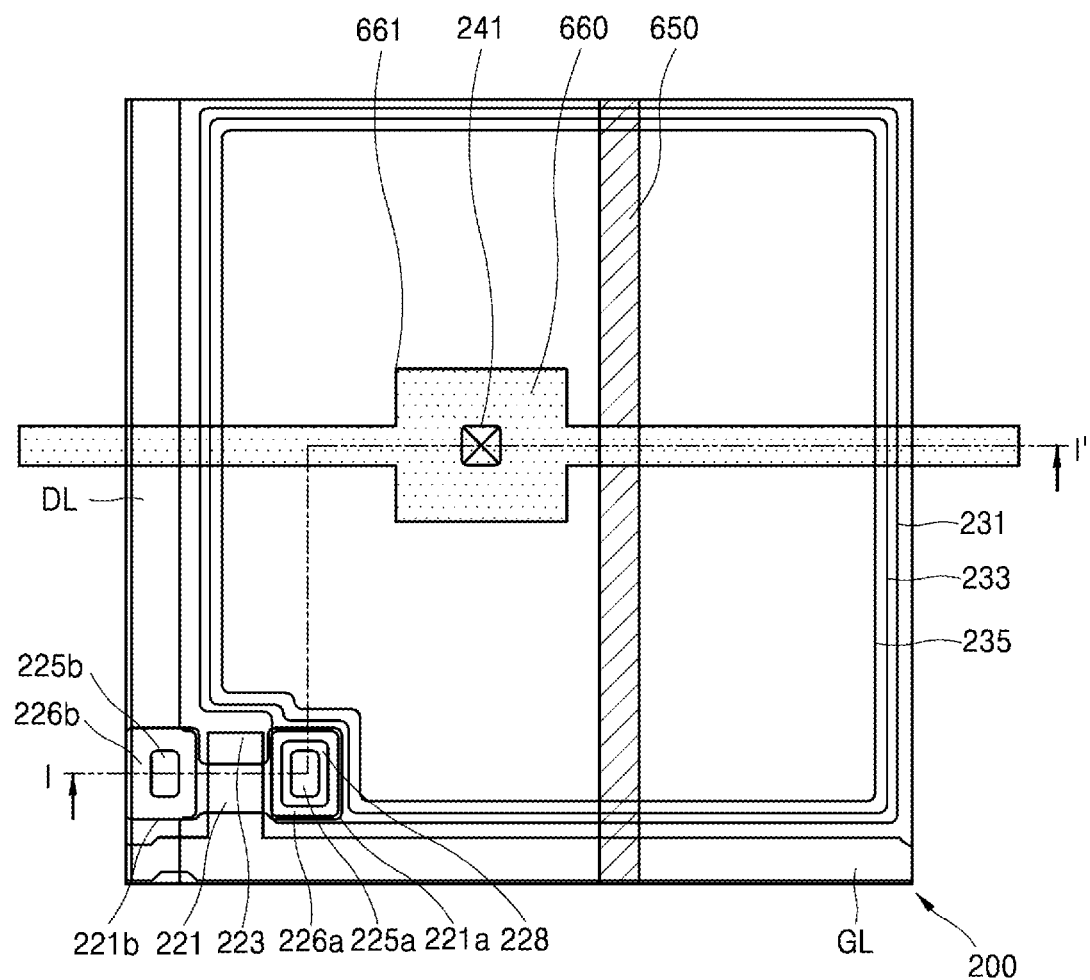
FIGS. 7A and 7B respectively illustrate a plan view and a cross-sectional view illustrating an array substrate for a digital X-ray detector according to a fifth embodiment of the present disclosure.
Figure 7B:
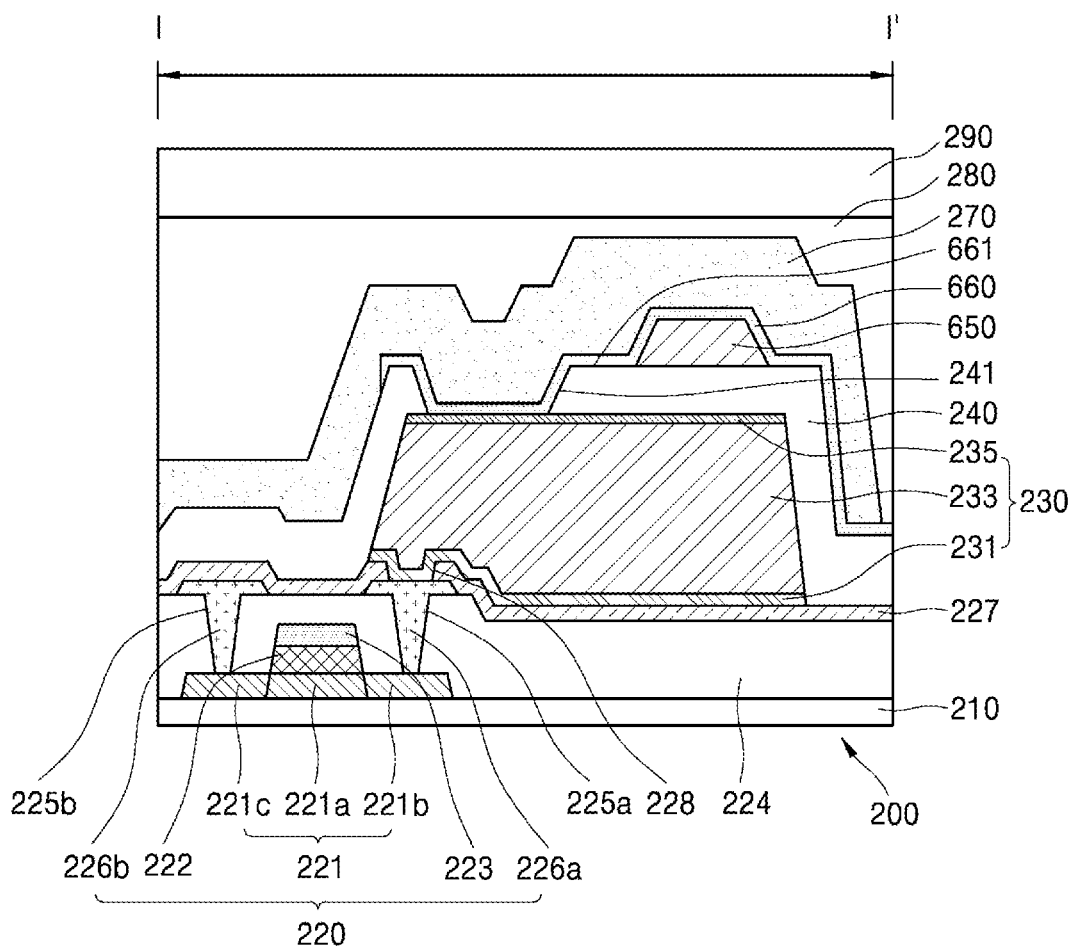

In accordance with a fifth embodiment shown in FIGS. 7A and 7B, a second protective layer 240 formed to cover the entire surface of the base substrate 210 including the upper electrode 235 may be disposed over the upper electrode 235. In this case, a third contact hole 241 may be disposed over the second protective layer 240 corresponding to the upper electrode 235, and a first bias electrode 650 may be disposed over the second protective layer 240 that does not include a third contact hole 241 and corresponds to the upper electrode 235.

A second bias electrode 660 may be formed over the second protective layer 240 including the third contact hole 241, such that the second bias electrode 660 may be connected to the upper electrode 235 of the PIN diode 230 through the third contact hole 241. The second bias electrode 660 may be arranged perpendicular to the first bias electrode 650 while simultaneously covering the first bias electrode 650, such that the second bias electrode 660 may be connected to the first bias electrode 650 at an intersection region of the second bias electrode 660 and the first bias electrode 650.

That is, the first bias electrode 650 is not in direct contact with the upper electrode 235, and is electrically connected to the upper electrode 235 through the second bias electrode 660.

As described above, the first bias electrode 650 does not directly contact the upper electrode 235, and is connected to the upper electrode 235 through the second bias electrode 660. Therefore, a separate contact margin region associated with the upper electrode 235 is no longer required, such that the light reception region of the PIN diode 230 is increased by a reduced contact margin region of the non-transparent first bias electrode 650, resulting in an increased fill factor.

In addition, since the first bias electrode 650 need not use a contact margin region associated with the upper electrode 235, the first bias electrode 650 may be formed to have a constant line width, resulting in an increased light reception region of the PIN diode 230.

The second bias electrode 660 contacts the upper electrode 235 in the third contact hole 241 of the second protective layer 240, resulting in formation of a contact margin region 661. However, the second bias electrode 660 is formed of a transparent conductive material such that the light reception region of the PIN diode 230 is not reduced. As a result, fill factor reduction caused by the contact margin region 661 can be minimized.

In addition, the second bias electrode 660 is formed in a mesh structure formed across several pixel regions, such that the plurality of first bias electrodes 650 may be disposed to cross the respective bias lines in a manner that all the first bias electrodes 650 of the respective pixel regions can be connected to each other.

Therefore, total resistance of the first bias electrode 650 is reduced, such that a line width (critical dimension) of the non-transparent first bias electrode 650 (i.e., a non-transparent bias line) can be reduced.

Therefore, the light reception region of the PIN diode 230 is increased by the reduced line width of the non-transparent first bias electrode 650, resulting in an increased fill factor of the PIN diode 230.

In accordance with the above-mentioned embodiments of the present disclosure, the second bias electrodes 260, 360, 460, 560, and 660 can be formed without separate additional processing.

In the array substrate 200 for the digital X-ray detector, a pad portion including various pad electrodes may be disposed at the outer wall of a pixel portion including a plurality of pixel regions. In this case, a metal anticorrosion layer formed of ITO may be formed over a metal electrode such as a bias electrode so as to prevent corrosion of each electrode, such that the metal electrode may be capped with the metal anticorrosion layer.

When capping of the ITO material is performed to prevent corrosion of the pad-portion metal electrode, the second bias electrodes 260, 360, 460, 560, and 660, each of which is formed of ITO, may be simultaneously formed by only one patterning process, such that additional patterning processes for forming only the second bias electrodes 260, 360, 460, 560, and 660 may not be used.

In more detail, through the patterning process after forming the ITO film over the entire surface of the array substrate 200, the metal anticorrosion layer formed of ITO at the pad portion and the second bias electrodes 260, 360, 460, 560, and 660 formed of ITO at the pixel portion may be formed by the same patterning process, such that fabrication efficiency is maximized.

A third protective layer 270, which is formed to cover the entire surface of the second protective layer 240 while simultaneously including the second bias electrodes 260, 360, 460, 560, and 660 and the first bias electrodes 250, 350, 450, 550, and 650, may also be disposed over the second bias electrodes 260, 360, 460, 560, and 660. The scintillator layer 290 may be disposed over the third protective layer 270.

In this case, the scintillator layer 290 may also be formed in a film shape over the third protective layer 270, an organic layer 280 may be disposed over the third protective layer 270, and the scintillator layer 290 including a plurality of scintillators may also be formed over the organic layer 280 through additional scintillator growth processing. In this case, the scintillator layer 290 may be formed of cesium iodide (CsI).

The above-mentioned digital X-ray detector may operate as follows.

X-rays emitted to the digital X-ray detector may be converted into visible light by the scintillator layer 290. The visible light may be converted into an electronic signal by the PIN layer 233 of the PIN diode 230.

In more detail, when visible light is emitted to the PIN layer 233, the intrinsic (I-type) semiconductor layer is depleted by the P-type semiconductor layer and the N-type semiconductor layer, and thus generates an electric field therein. Electrons and holes generated by light may be drifted by the electric field, and are then collected in the P-type semiconductor layer and in the N-type semiconductor layer, respectively.

The PIN diode 230 may convert visible light into an electronic signal, and may deliver the electronic signal to the thin film transistor 220. The delivered electronic signal may be displayed as an image signal after passing through the data line connected to the thin film transistor 220.

As is apparent from the above description, the embodiments of the present disclosure may include a dual bias electrode in which a bias electrode formed of a transparent conductive material is additionally disposed, and may reduce contact resistance between the upper electrode of the PIN diode and the bias electrode, such that voltage drop and heat generation can be minimized.

The present disclosure may select structures based on various embodiments associated with a dual bias electrode, may reduce a line width (critical dimension CD) of the bias electrode formed of a non-transparent conductive material, and may minimize the size of the bias electrode formed of a non-transparent conductive material by reducing a contact margin region. As a result, a light reception region of the PIN diode is increased in size, resulting in an increased fill factor.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An array substrate for a digital X-ray detector, comprising:
    a base substrate;
    a thin film transistor disposed over the base substrate;
    a PIN diode including a lower electrode connected to the thin film transistor, a PIN layer disposed over the lower electrode, and an upper electrode disposed over the PIN layer;
    a first bias electrode disposed over the PIN diode;
    a second bias electrode disposed over the first bias electrode;
    a protective layer over the second bias electrode, the protective layer being in contact with the second bias electrode; and
    an organic layer over the protective layer, the organic layer being in contact with the second bias electrode,
    wherein the first bias electrode includes a non-transparent conductive material, and the second bias electrode includes a transparent conductive material,
    wherein the first bias electrode is in direct contact with the upper electrode, and
    wherein the second bias electrode is electrically connected to the PIN diode via the first bias electrode.

2. The array substrate of claim 1, wherein:
    the first bias electrode is connected to the upper electrode, and the second bias electrode is connected to the first bias electrode,
    wherein the second bias electrode is disposed to cover an entire surface of the base substrate.

3. The array substrate of claim 1, wherein:
    the first bias electrode is connected to the upper electrode, and the second bias electrode is connected to the first bias electrode, wherein the second bias electrode is perpendicular to the first bias electrode.

4. The array substrate of claim 3, wherein the second bias electrode has a constant line width.

5. The array substrate of claim 1, wherein:
the first bias electrode is connected to the second bias electrode, and the second bias electrode is connected to the upper electrode,
wherein the second bias electrode is arranged perpendicular to the first bias electrode.

6. The array substrate of claim 5, wherein the first bias electrode has a constant line width.

7. An X-ray detector, comprising:
an array substrate for a digital X-ray detector, the array substrate including:
a base substrate;
a thin film transistor over the base substrate;
a PIN diode including a lower electrode connected to the thin film transistor, a PIN layer over the lower electrode, and an upper electrode over the PIN layer;
a first bias electrode over the PIN diode;
a second bias electrode over the first bias electrode;
a protective layer over the second bias electrode, the protective layer being in contact with the second bias electrode;
an organic layer over the protective layer, the organic layer being in contact with the second bias electrode; and
a scintillator layer disposed over the array substrate,
wherein the first bias electrode includes a non-transparent conductive material, and the second bias electrode includes a transparent conductive material,
wherein the first bias electrode is in direct contact with the upper electrode, and
wherein the second bias electrode is electrically connected to the PIN diode via the first bias electrode.

8. An array substrate for a digital X-ray detector, comprising:
a base substrate;
a thin film transistor over the base substrate;
a PIN diode including a lower electrode connected to the thin film transistor, a PIN layer over the lower electrode, and an upper electrode over the PIN layer;
a first bias electrode disposed over the PIN diode;
a second bias electrode disposed over the first bias electrode;
a protective layer over the second bias electrode, the protective layer being in contact with the second bias electrode; and
an organic layer over the protective layer, the organic layer being in contact with the second bias electrode,
wherein the first bias electrode is connected to the upper electrode, and the second bias electrode is connected to the first bias electrode,
wherein the second bias electrode is disposed to cover an entire surface of the base substrate,
wherein the first bias electrode is in direct contact with the upper electrode, and
wherein the second bias electrode is electrically connected to the PIN diode via the first bias electrode.

* * * * *